US 6,620,658 B2

(12) United States Patent
Isobe et al.

(10) Patent No.: US 6,620,658 B2
(45) Date of Patent: Sep. 16, 2003

(54) METHOD OF MANUFACTURING A SEMICONDUCTOR DEVICE

(75) Inventors: Atsuo Isobe, Kanagawa (JP); Toru Takayama, Kanagawa (JP); Tatsuya Arao, Kanagawa (JP); Akihiko Koura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/071,211

(22) Filed: Feb. 11, 2002

(65) Prior Publication Data

US 2002/0160554 A1 Oct. 31, 2002

(30) Foreign Application Priority Data

Feb. 16, 2001 (JP) .......................... 2001-041028

(51) Int. Cl.[7] .............................................. H01L 21/00
(52) U.S. Cl. .......................... 438/151; 438/151
(58) Field of Search .......................... 438/151–166, 438/763, 786, 787

(56) References Cited

U.S. PATENT DOCUMENTS

| | | |
|---|---|---|
| 6,261,877 B1 | 7/2001 | Yamazaki et al. |
| 6,323,142 B1 | 11/2001 | Yamazaki et al. |
| 6,329,229 B1 | 12/2001 | Yamazaki et al. |
| 6,492,659 B1 | 12/2002 | Yamazaki et al. |
| 6,492,681 B2 | 12/2002 | Koyama et al. |
| 6,498,369 B1 | 12/2002 | Yamazaki et al. |
| 2001/0009283 A1 | 7/2001 | Arao et al. |
| 2001/0015441 A1 | 8/2001 | Kawasaki et al. |
| 2002/0001886 A1 * | 1/2002 | Ohtani ....................... 438/151 |
| 2002/0043660 A1 | 4/2002 | Yamazaki et al. |
| 2002/0101395 A1 | 8/2002 | Inukai |
| 2002/0110940 A1 | 8/2002 | Yamagata et al. |
| 2002/0113248 A1 | 8/2002 | Yamagata et al. |
| 2002/0121860 A1 | 9/2002 | Seo et al. |

FOREIGN PATENT DOCUMENTS

JP     10-084085     3/1998

* cited by examiner

*Primary Examiner*—Richard Booth
(74) *Attorney, Agent, or Firm*—Eric J. Robinson; Robinson Intellectual Property Law Office, P.C.

(57) ABSTRACT

A gate insulating film of a TFT is formed without increasing a substrate temperature so that a substrate having a low heat resistance such as a plastic substrate can be used. Further, a structure in which an S value of the above TFT is improved and an off leak current is reduced is used to realize the improvement of reliability of a semiconductor device. In the case where the gate insulating film is formed, it is formed by sputtering so that a region having 0.4 atomic % to 1.6 atomic % is present at concentration measurement of hydrogen in the film by an HFS analysis (hydrogen forward scattering analysis). Then, an insulating film is formed thereon by sputtering so that a region having 0.2 atomic % or less is present at concentration measurement of hydrogen in the film by an HFS analysis. When a TFT is manufactured using such a structure of the gate insulating film, there are obtained TFT characteristics such that a subthreshold coefficient is low and a leak current flowing between a gate electrode and a source electrode or a leak current flowing between a gate electrode and a drain electrode is suppressed.

21 Claims, 15 Drawing Sheets

NTFT | PTFT
FIG. 1A 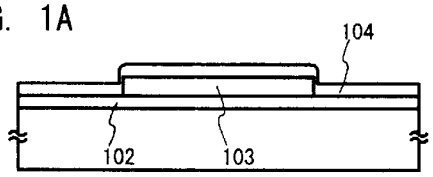 

FIG. 1C 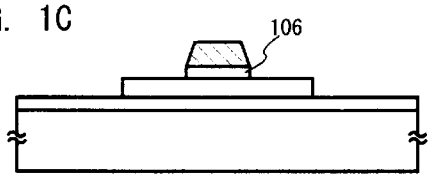 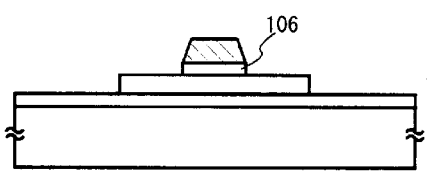
FIG. 1D 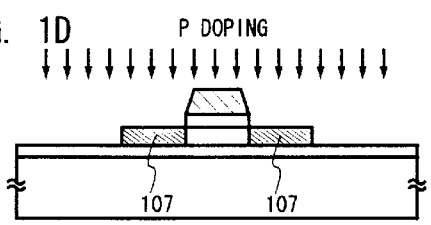 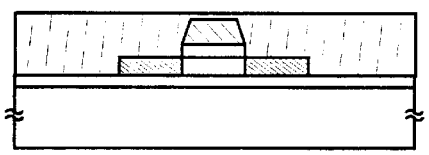
FIG. 1E 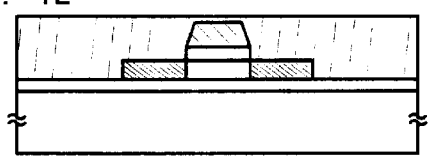 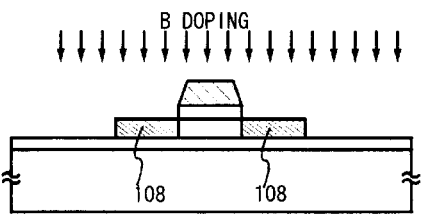
FIG. 1F 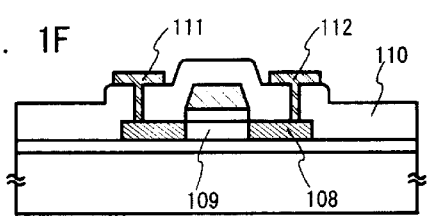 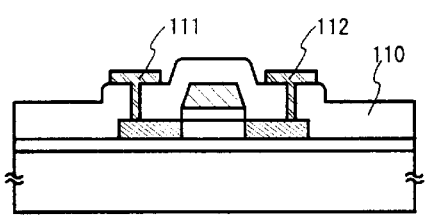

| NTFT | PTFT |

---- Theoretical     ---- Experimental

---- Theoretical     ---- Experimental

FIG. 4A  n-ch S-value [V/dec.] (VD= 1 V)
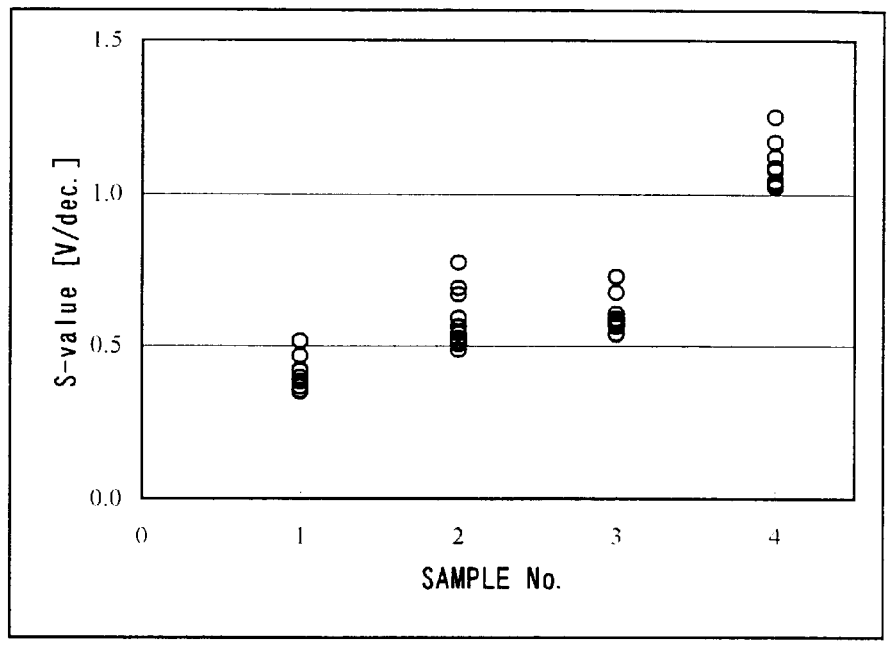
FIG. 4B  p-ch S-value [V/dec.] (VD= 1 V)
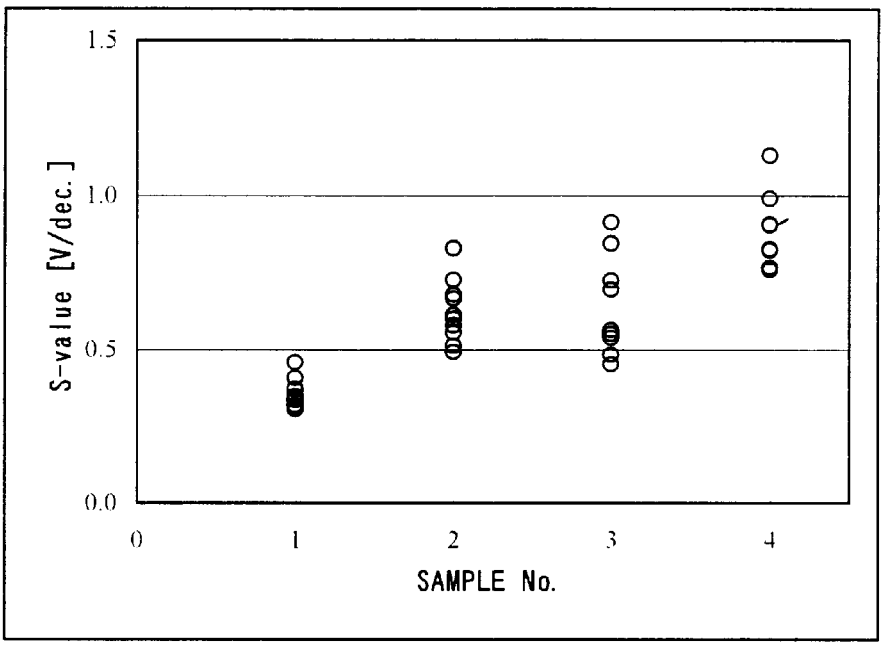
SAMPLE No.  1-- FIRST TFT STRUCTURE
2-- SECOND TFT STRUCTURE
3-- THIRD TFT STRUCTURE
4-- FOURTH TFT STRUCTURE FIG. 5A  n-ch IG_off [pA] (VD= 1 V, VG= −17.5 V)
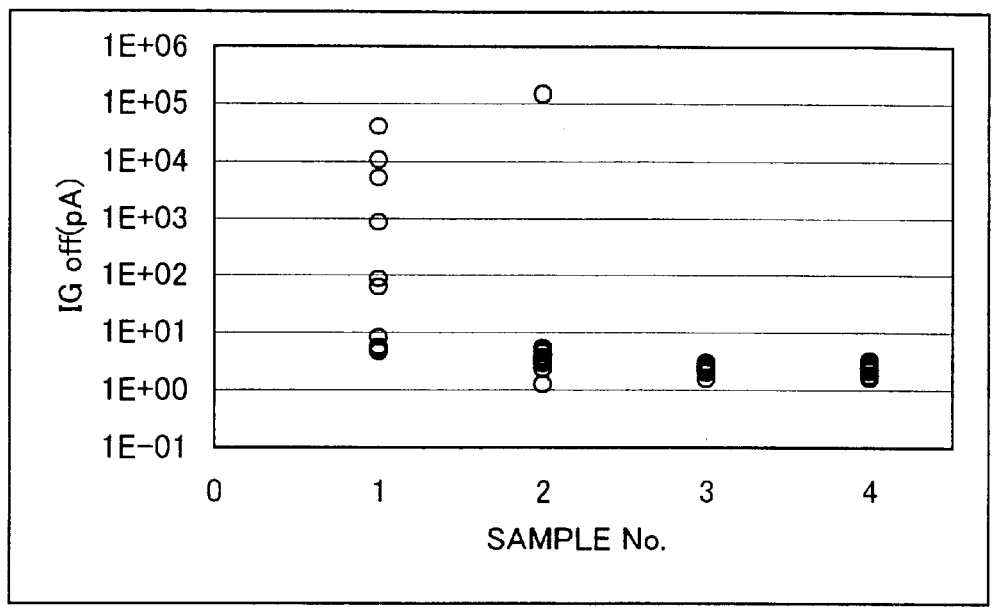
FIG. 5B  p-ch IG_off [pA] (VD= 1 V, VG= 10 V)
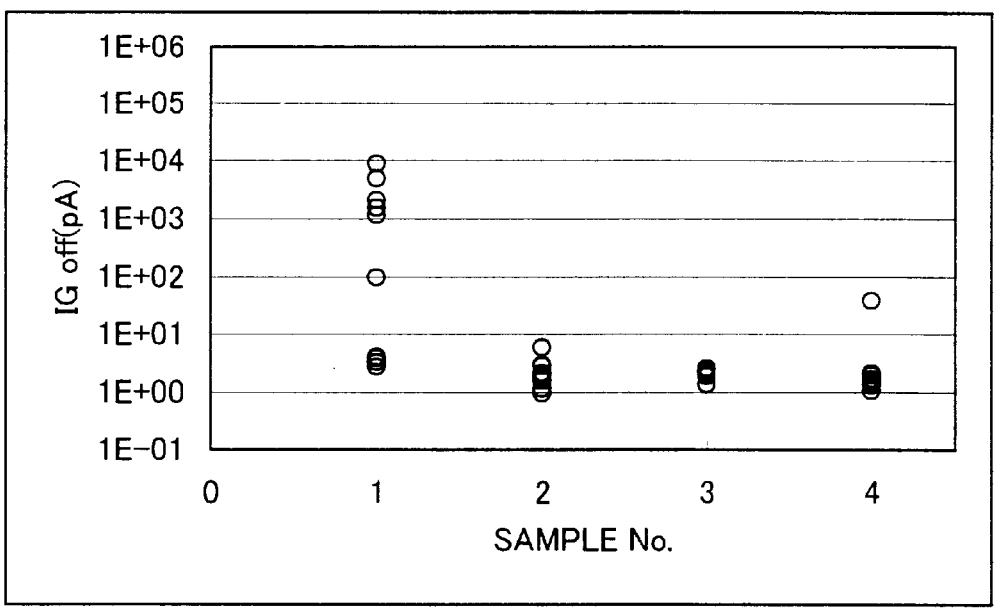
SAMPLE No.   1 — FIRST TFT STRUCTURE
             2 — SECOND TFT STRUCTURE
             3 — THIRD TFT STRUCTURE
             4 — FOURTH TFT STRUCTURE FIG. 6A  n-ch IG_on [pA] (VD= 1 V, VG=10 V)
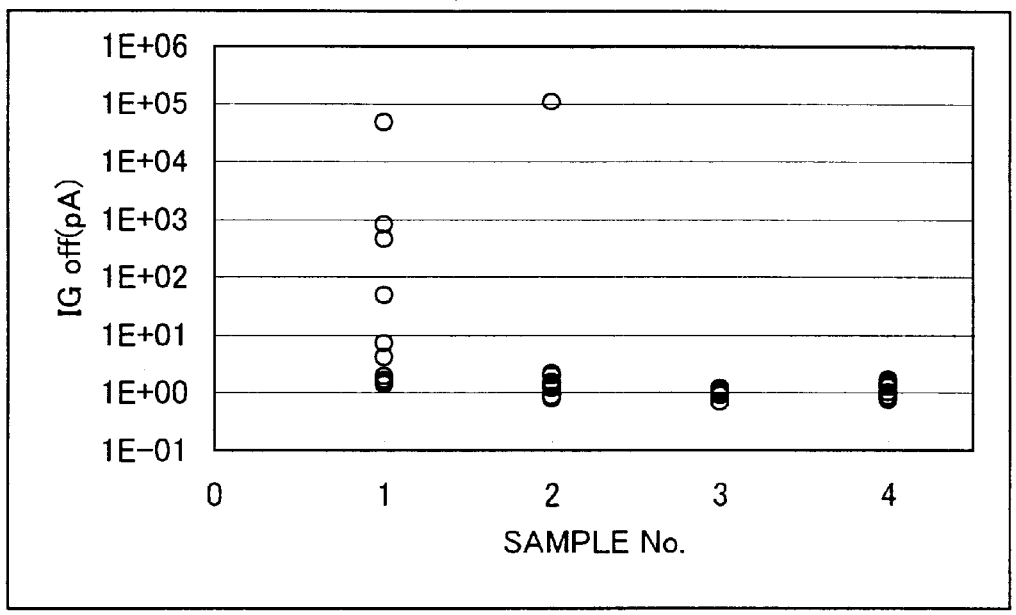
FIG. 6B  p-ch IG_on [pA] (VD= 1 V, VG=-17.5 V)
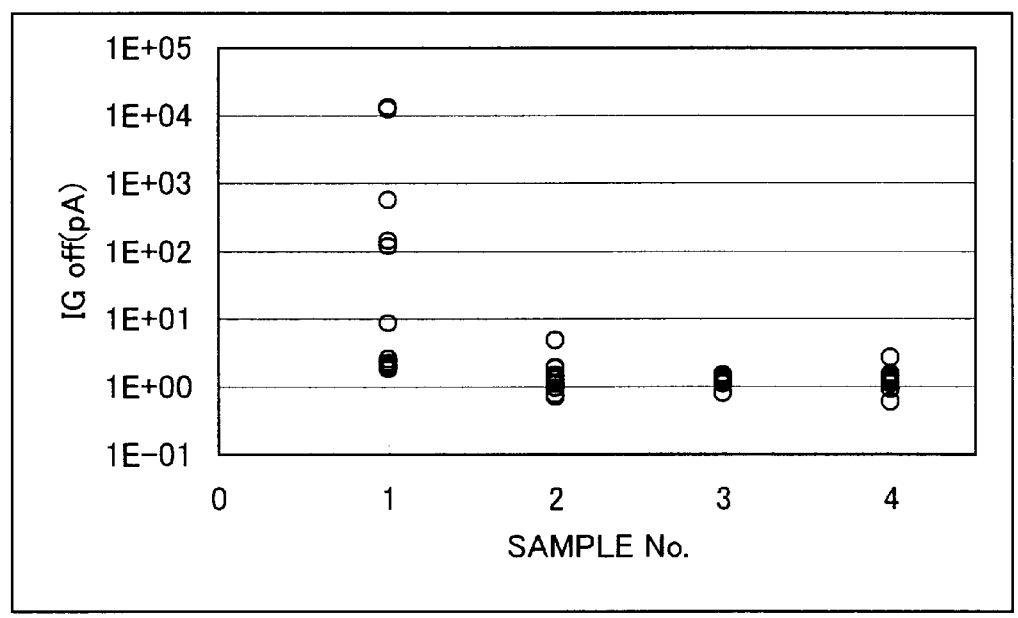
SAMPLE No.  
1— FIRST TFT STRUCTURE  
2— SECOND TFT STRUCTURE  
3— THIRD TFT STRUCTURE  
4— FOURTH TFT STRUCTURE

METHOD OF MANUFACTURING A SEMICONDUCTOR DEVICE

BACKGROUND OF THE INVENTION

1. Field of the Invention

The present invention relates to a method of manufacturing a semiconductor device having a circuit comprising thin film transistors (hereinafter referred to as TFTs). In particular, the present invention relates to a technique for manufacturing a TFT in a substrate having a low heat resistance such as a plastic substrate. Note that the semiconductor devices in this specification indicate devices in general which function by utilizing semiconductor characteristics, and electro-optical devices, semiconductor circuits, and electronic equipment in which those units are mounted are included in the category of the semiconductor devices.

2. Description of the Related Art

Since a thin film transistor (hereinafter referred to as TFT) can be formed on a transparent substrate, development for applications to an active matrix liquid crystal display (hereinafter referred to as an AM-LCD) is in active progress. Since high mobility is obtained in the case of a TFT using a semiconductor film having a crystal structure (hereinafter referred to as crystalline semiconductor film), functional circuits can be integrated on the same substrate to realize high resolution image display. In particular, with respect to an active matrix display device represented by a liquid crystal display device, a technique for forming not only a pixel portion but also a driver circuit by using TFTs is under development.

With respect to such a display device, ones of varying sizes are manufactured. In particular, applications to a mobile electronic device are noted. In the case of the mobile electronic device, it is said that weight reduction of individual parts is required and the display device is no different. Until now, a glass plate having a thickness of about 1 mm is used as a substrate composing the display device. However, a method of using a plastic substrate is examined for the weight reduction thereof.

However, since a process temperature of the TFT using the crystalline semiconductor film is about 400° C., it is impossible to apply this technique to the plastic substrate as it stands. When the TFT is formed on the plastic substrate, it is necessary to form the crystalline semiconductor film, a gate insulating film, and the like at about 300° C. or lower. A film formation technique using a sputtering method is one of the techniques capable of forming not only a conductive film but also an insulating film and a semiconductor film at a relatively low temperature. An attempt has already been made, in which the gate insulating film of the TFT is formed by a sputtering method. However, preferable characteristics cannot be necessarily obtained.

An index indicating TFT characteristics includes a subthreshold coefficient (S value). This is obtained based on a relationship between a drain current flowed in a weak inverse state when a voltage close to a threshold voltage or a lower voltage is applied to the gate electrode and the gate voltage. Generally, the smaller the subthreshold coefficient is, the more possible a switching operation at high speed and low consumption power becomes. The TFT characteristics in the case where a gate insulating film is formed by a sputtering method is reported by, for example, Serikawa (Japan, J. Appl. Phys. Vol. 39 (2000), pp. L393–395). According to this report, when an $SiO_2$ target is used and the gate insulating film is formed by using a sputtering gas of oxygen (30%) and argon (70%), the S value is 2.5 V/dec in an n-channel TFT and 1.8 eV/dec is obtained in a p-channel TFT.

When a switching characteristic required in the case where a TFT is applied to a display device and the like is considered, this S value is not necessarily enough one. It is considered that there are various factors for deteriorating the TFT characteristic in the case where the gate insulating film is formed by a sputtering method, and that the control of concentration of hydrogen included in the insulting film is a most important factor.

Also, since a large number of traps are present in a crystalline silicon layer or in an interface between the crystalline silicon layer and a gate insulating film, there is a problem in that a threshold voltage (Vth) of a TFT is increased or high mobility is not obtained. Thus, it is required that hydrogen be diffused into the crystalline silicon layer or the interface between the crystalline silicon layer and the gate insulating film to terminate the traps so that film property of the crystalline silicon film is improved.

Until now, there is a case where a TFT is manufactured by a film formation method of controlling the amount of hydrogen added into a film. According to, for example, Japanese Patent Application Laid-open No. Hei 10-0845085, an interlayer film made from a silicon nitride film including hydrogen or a silicon oxynitride film including hydrogen is formed over a TFT and hydrogen is diffused from the silicon nitride film including hydrogen or the silicon oxynitride film including hydrogen to the TFT. Thus, a transistor characteristic can be made stable by hydrogenation processing at a lower substrate temperature. Note that, when the silicon nitride film or the silicon oxynitride film including hydrogen is formed by a film formation method in which a substrate processing temperature exceeds 400° C. it is difficult to apply such a method to a plastic substrate.

SUMMARY OF THE INVENTION

The present invention is to provide a technique for solving such a problem, and an object thereof is therefore to form an insulating film by sputtering on a plastic substrate which is low in upper limit of a process temperature to thereby improve the characteristics of a TFT.

The present invention is characterized in that a sputtering method is used and a film formation condition is divided into a first stage and a second stage in the case where the gate insulating film of a TFT is formed. In the first stage, the gate insulating film is formed so as to include hydrogen therein at a concentration of 0.4 atomic % to 1.6 atomic %. For example, a method of performing sputtering with a silicon target using argon, $N_2O$, and hydrogen as sputtering gases is employed. In the second stage, the gate insulating film is formed so as to include hydrogen therein at a concentration of 0.2 atomic % or lower. For example, a method of performing sputtering with an $SiO_2$ target using argon and oxygen as sputtering gases is employed.

An object of the first stage is to include hydrogen in the gate insulating film and an object of the second stage is to form a dense film in which the amount of hydrogen to be included is less and to prevent hydrogen included in the gate insulating film in the first state from being released to the outside. Thus, the gate insulating film of the present invention is formed in a two-layer structure.

When hydrogen is included at the above concentration in an interface between the gate insulating film and a semiconductor layer and its vicinity by a first film formation method, a defect density in the interface and the film can be reduced. Also, internal stress is relaxed (decreased) to reduce stress applied to the semiconductor layer and the interface and thus not only an S value but also a shift in a threshold voltage can be suppressed. Further, a part of hydrogen included in a region of the gate insulating film formed in the first stage can be diffused to contribute to hydrogenation of the semiconductor layer. The gate insulating film formed in the second stage is a relatively dense film. Thus, when hydrogen produced in the first stage is contained to prevent diffusion thereof to the outside, it is possible to keep the effect of hydrogen.

A substrate temperature at the formation of the gate insulating film is set to be 300° C. in both the first stage and the second stage. As a result the gate insulating film having the two-layer structure can be formed for a plastic substrate.

As described above, a method of manufacturing a semiconductor device according to the present invention is characterized by including the steps of: forming a semiconductor layer on an insulating surface; forming a gate insulating film on the semiconductor layer; and forming a conductive layer on the gate insulating film, in that the step of forming the gate insulating film is performed by a sputtering method using Si or $SiO_2$ as a target and has a first stage for forming a first insulating film including mainly Si, oxygen, and nitrogen and further including hydrogen at a concentration of 0.4 atomic % to 1.6 atomic % and a second stage for forming a second insulating film including mainly Si and oxygen and further including hydrogen at a concentration of 0.2 atomic % or lower.

Also, since the present invention is characterized in that film formation is performed at a low temperature it is very suitable for a plastic substrate, while it can be also applied to a glass substrate and a quartz substrate. Even when it is applied to a glass substrate and a quartz substrate, effects such as cost reduction and improvements of throughput due to a decrease in a process temperature are obtained.

Note that there are an SIMS analysis and a hydrogen forward scattering (HFS) analysis as typical methods of measuring a hydrogen concentration in a film. The HFS analysis is a method of irradiating an $He^{++}$ ion to a sample and measuring energy of a scattered $He^{++}$ ion to determine a sample composition from a loss of the energy. The reason why the hydrogen concentration in the film is measured by the HFS analysis is as follows. That is, in the case where the concentration of hydrogen becomes about several % as the film of the present invention, when it is measured by the SIMS analysis, a measurement error is increased due to a matrix effect. Thus, the present inventor determined that the HFS analysis is reasonable. Also, in the case of the HFS analysis, an $He^{++}$ ion as a probe is irradiated to a sample in a range of $\phi$ of 5 mm to 10 mm. When $\phi$ is in the range of 5 mm to 10 mm and a film thickness is 10 nm or more, the measurement is possible. When an opening and the like are present in the range of $\phi$ of 5 mm to 10 mm in a film to be analyzed by the HFS analysis to produce an uneven portion, although the influence of a base is caused the measurement is possible. Thus, when a layer located on a film to be analyzed is peeled to be exposed in a completed semiconductor device, the HFS analysis is possible.

According to the HFS analysis performed in this specification, a result such that hydrogen is included at 0.2 atomic % or lower in the second stage is obtained. With respect this result, there is also a possibility that the concentration of hydrogen is 0 atomic % because of an analysis error.

BRIEF DESCRIPTION OF THE DRAWINGS

In the accompanying drawings:

FIGS. 1A to 1F show manufacturing steps of a TFT;

FIGS. 4A and 4B show comparisons of subthreshold coefficient characteristics of the TFT according to the present invention;

FIGS. 5A and 5B show comparisons of values of leak current flowing between a gate and a source in the TFT according to the present invention;

FIGS. 6A and 6B show comparisons of values of leak current flowing between the gate and the source in the TFT according to the present invention;

DETAILED DESCRIPTION OF THE PREFERRED EMBODIMENTS

Figure 1B:
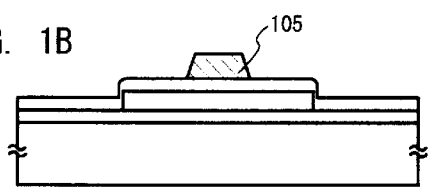

An embodiment mode of the present invention will be described below. One example of a method of manufacturing a TFT according to the present invention is shown in FIGS. 1A to 1F.

First, a base insulating film 102 is formed on a substrate 101. A plastic substrate is used as the substrate 101. The plastic substrate made of, for example, polyimide, acrylic, PET (polyethylene terephthalate), polycarbonate, polyallylate. PEEK (polyether etherketone), PES (polyether sulfone), PEN (polyether nitrile), or the like can be used. Here, an example in the case where a substrate made of polyimide, which is sufficiently resistible to thermal treatment at 350° C. is used is indicated.

The base insulating film 102 is formed by a sputtering method. When a plasma CVD method is used, it is preferably formed at a substrate temperature of a room temperature to 350° C.

Next, an amorphous semiconductor film is formed on the base insulating film 102 by a known technique (sputtering method, a PCVD method, a vacuum evaporation method, a photo CVD method, or the like). Then, the amorphous semiconductor film is crystallized by a known technique to form a crystalline semiconductor film. However, when a polyimide substrate is used, it is not resistant to thermal treatment at a temperature which exceeds 350° C. Thus, it is preferable that the amorphous semiconductor film is crystallized by laser light irradiation. Note that, in the case of the crystallization by laser light irradiation, it is required that the amount of hydrogen included in the amorphous semiconductor film before the irradiation is made to be 5 atomic % or less. Thus, a film formation method or a film formation condition such that a hydrogen concentration is low in a stage immediately after film formation is preferable. For this, there is, for example, a method of forming a film in an atmosphere in which hydrogen is not included as a sputtering gas by a sputtering method or a method of diluting silane as a sputtering gas at film formation with hydrogen in a PCVD method.

Then, the crystalline semiconductor film is patterned to form a semiconductor layer 103 as the active layer of a TFT.

Then, a gate insulating film 104 covering the semiconductor layer 103 is formed (FIG. 1A). The gate insulating film 104 is formed by using a sputtering method.

In the first stage, the gate insulating film is formed to include hydrogen therein at a concentration of 0.4 atomic % to 1.6 atomic %. Thus, sputtering with an $SiO_2$ target using argon, oxygen, hydrogen, and $N_2O$ as sputtering gases is performed for film formation. Alternatively sputtering with a silicon target using argon, oxygen, hydrogen, and $N_2O$ as sputtering gases is performed for film formation. Sputtering with a target of SiN using argon, oxygen, hydrogen, and $N_2O$ as sputtering gases may also be performed for film formation. In this case, a cluster of Si is hard to be produced. Thus, a withstanding voltage characteristic is improved as compared with the case where a gate insulating film is formed using Si or $SiO_2$ as a target.

In the second stage, the gate insulating film is formed to include hydrogen therein at a concentration of 0.2 atomic % or lower. Sputtering with an $SiO_2$ target using argon and oxygen as sputtering gases is performed for film formation. Alternatively, sputtering with a silicon target using argon and oxygen as sputtering gases is performed for film formation.

Then, a gate electrode 105 is formed on the gate insulating film (FIG. 1B). The gate electrode 105 is formed by patterning a conductive film formed by a sputtering method in a predetermined shape.

Next, the gate insulating film is etched in a self alignment using the gate electrode 105 as a mask to form a gate insulating film 106 (FIG. 1C) and to expose a portion of the semiconductor layer. Then, an impurity element for providing an n-type, here, phosphorus is added (doped) to the portion of the semiconductor layer to form impurity regions 107 (FIG. 1D). At this time, a resist is formed for a p-channel TFT and peeled after the addition of the impurity for providing the n-type.

Next, the gate insulating film is etched in a self alignment using the gate electrode as a mask to form a gate insulating film and to expose a portion of the semiconductor layer. Then, an impurity element for providing a p-type, here, boron is added (doped) to the portion of the semiconductor layer to form impurity regions 108 (FIG. 1E). At this time, a resist is formed for an –channel TFT and peeled after the addition of the impurity for providing the p-type.

Next, an interlayer insulating film 110 is formed and respective contact holes which reach the source region or the drain region are formed. Then, a source wiring 111 electrically connected with the source region and a drain wiring 112 electrically connected with the drain region are formed.

Then, hydrogenation processing is performed to improve the TFT characteristics. Thermal treatment in a hydrogen atmosphere or plasma hydrogenation at a low temperature is performed as this hydrogenation. Here, thermal treatment is performed in a hydrogen atmosphere at 350° C. for 1 hour.

Top gate TFTs are completed on the plastic substrate at a process temperature of 350° C. or lower through the above manufacturing steps (FIG. 1F). Note that, when plasma hydrogenation is performed by hydrogenation processing at a low temperature, TFTs are completed on the plastic substrate at a process temperature of 300° C. or lower.

Figure 3A:
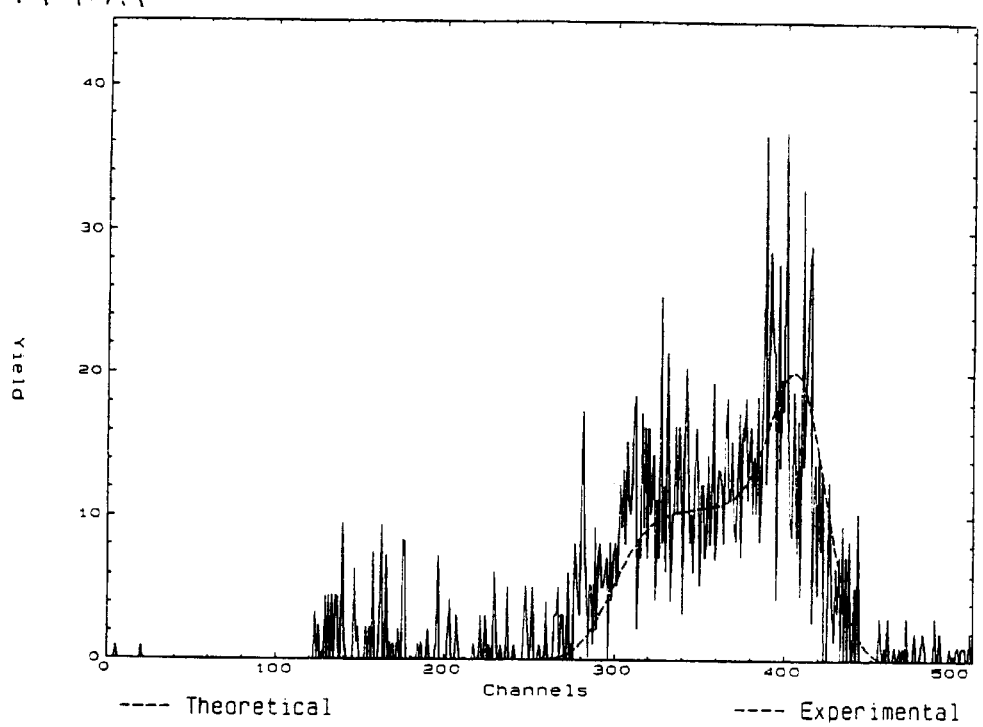
FIGS. 3A and 3B show HFS analysis results indicating concentrations of hydrogen in an insulating film.
Figure 3B:
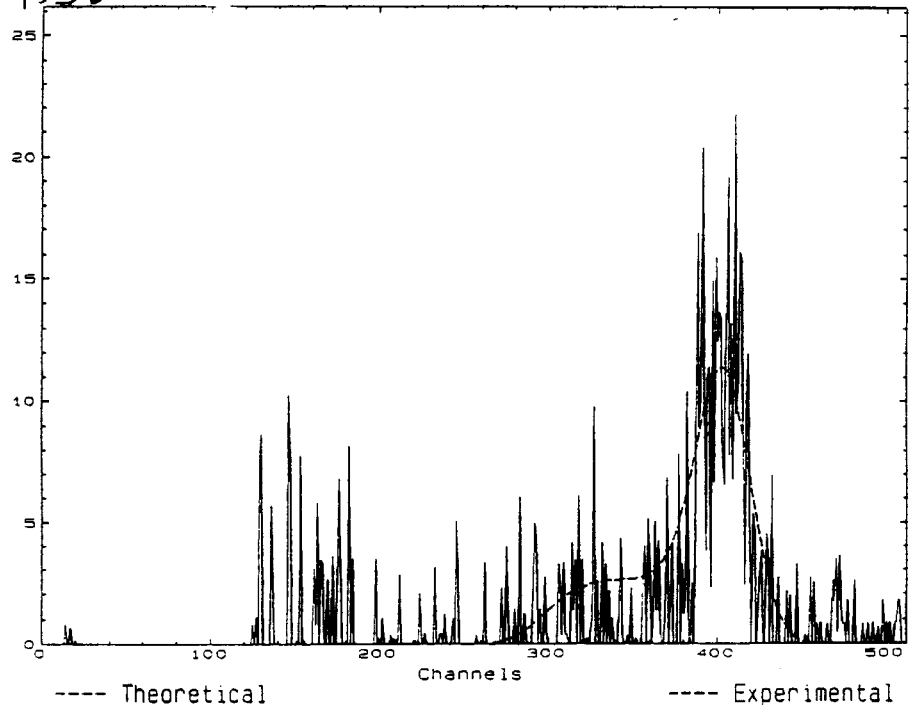

An insulating film is formed in the first stage by the present inventor. FIGS. 3A and 3B show results obtained by measuring the concentration of hydrogen in the insulating film formed in the first stage by the HFS. FIG. 3A shows an HFS spectrum indicating the concentration of hydrogen in the insulating film formed in the first stage. At this time, a detection angle against an irradiated $He^{++}$ ion beam is 30° and a sample is located at 75° against the normal direction. Also, Table 1 indicates a concentration distribution in a depth direction, which is obtained from the result of FIG. 3A. A film formation condition in the first stage is as follows. That is, silicon is used as a target. Sputtering gases are $N_2O$ and $H_2$ and these flow rates are set to be 40 sccm and 30 sccm, respectively. Ar as a gas for heating the substrate is flowed into a chamber at 10 sccm. Film formation power is set to be 3 kW and a film formation pressure is set to be 0.4 Pa.

TABLE 1

| Film formation gas | Depth direction (nm) | Concentration (atomic %) | | |
|---|---|---|---|---|
| | | H | O | Si |
| $N_2O/H_2$ = 40/30 sccm | 0 to 30 | 3 | 64.7 | 32.3 |
| | 30 to 235 | 0.8 | 66.1 | 33.1 |
| | 235 or more | — | — | 100 |
| $N_2O/H_2$ = 50/0 sccm | 0 to 30 | 2 | 65.7 | 32.3 |
| | 30 to 225 | 0.2 | 66.5 | 33.3 |
| | 225 or more | — | — | 100 |

Concentration measurement values of hydrogen in the vicinity of the surface of a gate insulating film and in a film of a lower layer portion in Table 1 include an error. Thus, when calculating based on a measurement condition using the concentration value of hydrogen in a film in the case where a depth (direction) is 30 nm to 235 nm in Table 1, it can be said that the range of the concentration value of hydrogen in a film is 0.4 atomic % to 1.6 atomic %.

Also, according to the present inventor, a flow rate of $H_2$ as a sputtering gas in a chamber at film formation is set to be 0 sccm and an insulating film is formed. FIG. 3B shows an HFS spectrum indicating the concentration of hydrogen in the insulating film formed in the second stage as in the case of FIG. 3A. Also, a concentration distribution in a depth direction, which is obtained from the result of FIG. 3B is indicated in Table 1 as in the above case. This insulating film is formed under the following condition. That is, silicon is used as a target. Sputtering gases are $N_2O$ and $H_2$ and these flow rates are set to be 50 sccm and 0 sccm, respectively. Ar as a gas for heating the substrate is flowed into a chamber at 10 sccm. Film formation power is set to be 3 kW and a film formation pressure is set to be 0.4 Pa. Although the concentration of hydrogen in a film is indicated to be 0.2 atomic % or lower in Table 1, this means a lower limit of detection or less.

That is, hydrogen in a film is added by flowing $H_2$ as a sputtering gas. $H_2$ becomes plasma in a chamber. Thus, when at least a gas including a hydrogen atom is not flowed as a sputtering gas, it is considered that the concentration of hydrogen in a film is 0.2 atomic % or lower. Also, when a gas including a hydrogen atom is not flowed as a sputtering gas even in the first stage, it is considered that the concentration of hydrogen in a film is 0.2 atomic % or lower.

Thus, the insulating film at film formation by sputtering using a hydrogen gas in this specification can be specified based on the concentration of hydrogen by an HFS analysis. The concentration of hydrogen in a film is in a range of 0.4 atomic % to 1.6 atomic % by measurement precision.

According to the present inventor, a TFT is manufactured through the above steps and estimated. Note that respective layers such as a base $SiO_2$ layer, an amorphous semiconductor film, a gate insulating film, a gate electrode, an interlayer $SiO_2$ film, and wirings are formed by sputtering. In each case of those layers, a substrate temperature at film formation is set to be 300° C. or lower.

When TFT estimation is performed, four TFTs having different structures are manufactured to make comparisons of an effect in the case where hydrogen is added to a gate insulating film.

In order to make the following description easy with respect to a laminate structure of the gate insulating film, the gate insulating film is divided into three structures. A first structure of the gate insulating film is given as a structure such that an insulating film is formed on the semiconductor layer in the first stage and an insulating film is formed thereon in the second stage. A second structure of the gate insulating film is given as a structure such that an insulating film is formed on the semiconductor layer in the second stage. A third structure of the gate insulating film is given as a structure such that an insulating film is formed on the semiconductor layer in the first stage.

The four TFTs having different structures, which are manufactured by the present inventor are indicated below.

A first TFT structure is obtained by making the gate insulating film to be the third structure. At this time, a film thickness of the gate insulating film is set to be 155 nm.

A second TFT structure is obtained by making the gate insulating film to be the first structure. At this time, a film thickness of the insulating film formed in the first stage is set to be 20 nm and a film thickness of the insulating film formed in the second stage is set to be 95 nm.

A third TFT structure is obtained by making the gate insulating film to be the first structure. At this time, a film thickness of the insulating film formed in the first stage is set to be 4 nm and a film thickness of the insulating film formed in the second stage is set to be 115 nm.

A fourth TFT structure is obtained by making the gate insulating film to be the second structure. At this time, a film thickness of the insulating film is set to be 115 nm.

That is, with respect to the first TFT structure, the second TFT structure, the third TFT structure, and the fourth TFT structure, the insulating films are formed on the semiconductor layer in the first stage at film thicknesses of 115 nm, 20 nm, 4 nm, and 0 nm, respectively.

When film formation is performed in the first stage in the case of the third TFT structure, it is intended that the film is formed at a sufficiently small film thickness as compared with 115 nm. Thus, when the insulating film is formed in the second stage, the film thickness in the first stage is neglected and a total film thickness becomes 119 nm. Hereinafter, 4 nm is assumed to be extremely smaller than 115 nm and it is considered that the film thickness of the insulating film in the respective cases of the first TFT structure to the fourth TFT structure is 115 nm.

The characteristics of a single gate TFT, which is thus manufactured and designed with a length of 8 μm and a width of 8 μm are shown in FIGS. 4A, 4B, 5A, 5B, 6A and 6B.

With respect to FIGS. 4A and 4B, numbers 1, 2, 3 and 4 in abscissa indicate the respective cases of the first TFT structure to the fourth TFT structure and ordinate indicates a subthreshold coefficient. A unit of a subthreshold coefficient in ordinate is V/dec. FIG. 4A shows characteristics of an n-channel TFT and FIG. 4B shows characteristics of a p-channel TFT. In FIGS. 4A and 4B, values of respective TFT characteristics in 10 points within the surface of a substrate having 5-inches square are indicated. Variation in characteristic values is dependent on the thickness of a silicon layer within the surface. That is, when the thickness of the silicon layer is made uniform, variation in the characteristic values becomes small.

As can be seen from FIGS. 4A and 4B, when the film thickness of the gate insulating film is kept constant in the respective cases of both the n-channel TFT and the p-channel TFT, the subthreshold coefficient is improved with increasing the film thickness of the insulating film formed in the second stage. It is considered that the reason why the subthreshold coefficient is improved in the case where the insulating film including hydrogen is formed as a lower layer is because the surface of non-crystalline silicon is exposed to hydrogen plasma at the formation of the insulating film and a dangling bond for trapping a charge is terminated with hydrogen to reduce the influence of trap on characteristics. According to experiments by the present inventor, the thickness of the insulating film formed in the first stage is set to be a minimum of 4 nm. However, when plasma processing is performed, there is a possibility that the TFT characteristics is improved even in the case where the insulating film is not formed on silicon.

With respect to FIGS. 5A, 5B, 6A and 6B, numbers 1, 2, 3, and 4 in abscissa indicate the respective cases of the first TFT structure to the fourth TFT structure and ordinate indicates a value of leak current flowing between a gate and a source. A unit of a current value in ordinate is pA. FIGS. 5A and 6A show characteristics of an n-channel TFT and FIGS. 5B and 6B show characteristics of a p-channel TFT. Also, FIGS. 5A and 5B indicate the cases where the TFT is in an OFF state, that is, a current does not flow between the source and the drain and FIGS. 6A and 6B indicate the cases where the TFT is in an ON state, that is, a current flows between the source and the drain.

According to FIGS. 5A, 5B, 6A and 6B, when the film thickness of the gate insulating film is kept constant, a leak current value is decreased with increasing the film thickness of the insulating film formed in the second stage. From the result that the leak current value is decreased, it is clear that the insulating film formed in the second stage has superior insulation property as compared with the insulating film formed in the first stage. Note that values of respective TFT characteristics in 10 points within the surface of a substrate having 5-inches square are indicated in FIGS. 5A, 5B, 6A and 6B. It is considered that variation in characteristic values in the case of the first TFT structure is due to in-plane nonuniformity of property of the insulating film.

Figure 14A:
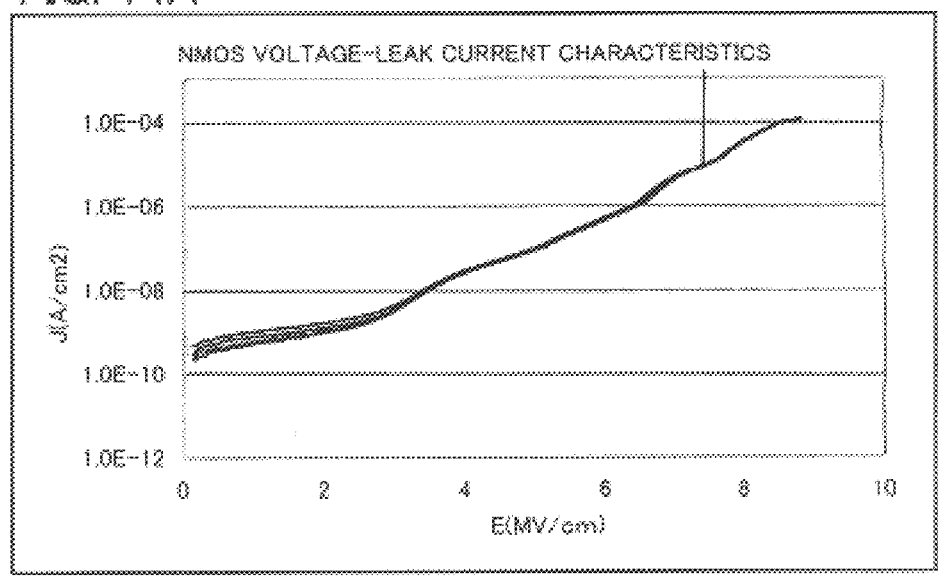
FIGS. 14A and 14B show voltage-leak current characteristics in the case where a concentration of nitrogen in an insulating film is high.
Figure 14B:
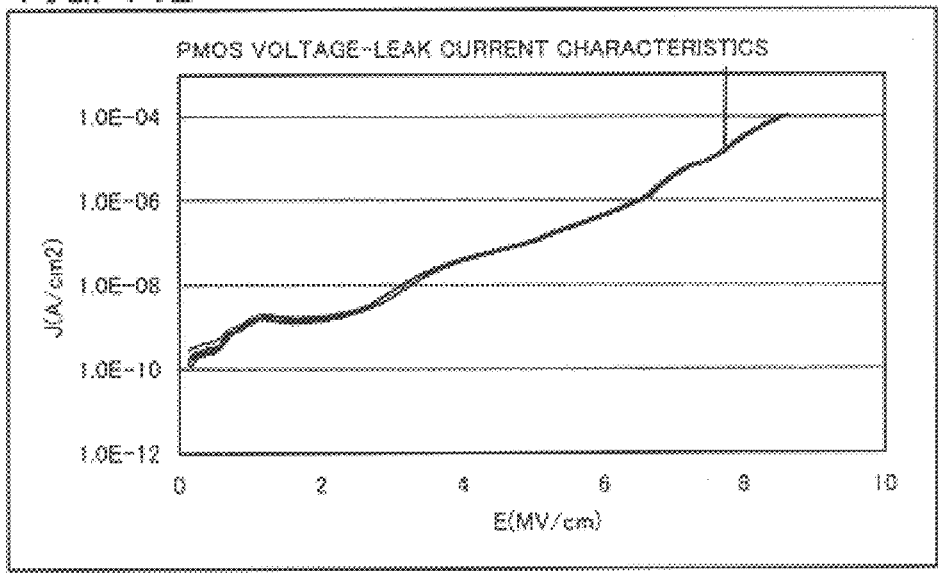
Figure 15A:
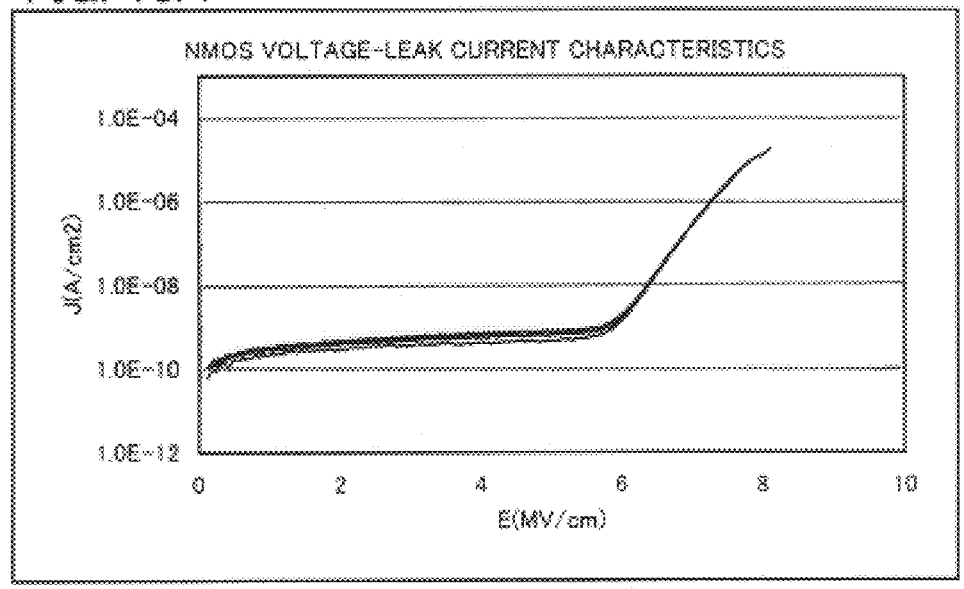
FIGS. 15A and 15B show voltage-leak current characteristics in the case where a concentration of nitrogen in an insulating film is low.
Figure 15B:
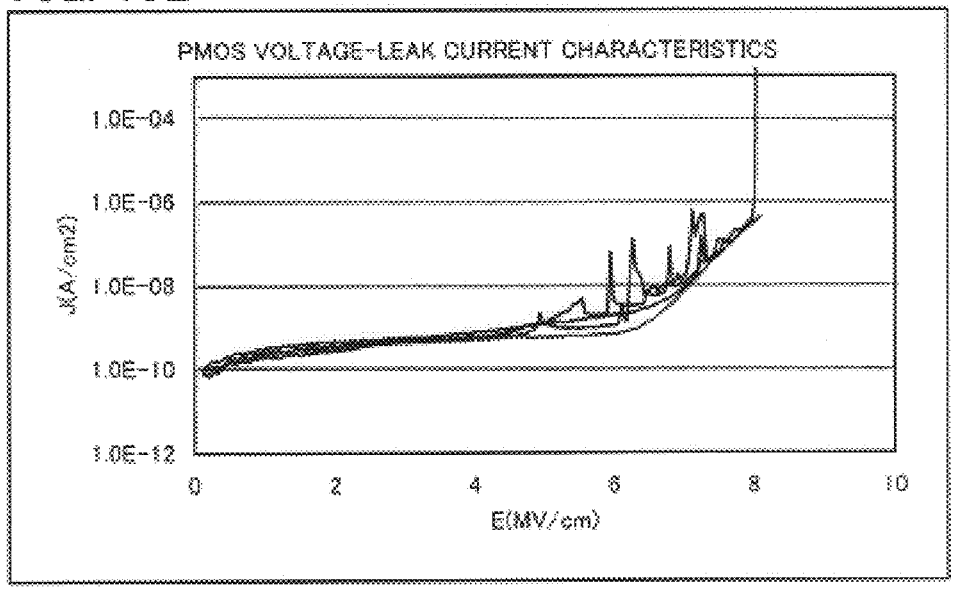

It is considered that the reason why the leak current value of the insulating film formed in the second stage is decreased is due to the amount of nitrogen in a film. FIGS. 14A, 14B, 15A and 15B show MOS voltage-leak current characteristics of an insulating film formed on a silicon wafer by CVD. Measurement is performed at a current density of $1\times10^{-6}$ A/cm$^2$ in the respective cases. FIGS. 14A and 14B show characteristics of an insulating film having a high nitrogen concentration, that is, characteristics of an insulating film including mainly nitrogen at a nitrogen concentration of about 37 atomic %. FIGS. 15A and 15B show characteristics of an insulating film having a small nitrogen concentration, that is, characteristics of an insulating film including a nitrogen atom at $2\times10^{20}$ atomic/cm$^3$. In the TFT of the present invention, the thickness of the gate insulating film is 115 nm. Also, when this TFT is used for driving liquid crystal, a voltage for driving liquid crystal is 20 V. Thus, an electric field of 1.74 MV/cm is generally applied to the gate insulating film. When comparisons of a leak current at the application of this electric field are made in FIGS. 14A, 14B, 15A and 15B it is determined that a leak current is small in the case where the concentration of nitrogen in the insulating film is low.

Also, according to FIGS. 14A and 14B, withstanding voltages of the insulating film having a high nitrogen concentration are 6.4 MV/cm in an n-type MOS and 6.5 MV/cm in a p-type MOS. On the other hand, according to FIGS. 15A and 15B, withstanding voltages of the insulating film having a low nitrogen concentration are 7.3 MV/cm in an n-type MOS and 8.1 MV/cm in a p-type MOS. According to this result, even when the gate insulating film is thinner than 115 nm or a high voltage is applied thereto, preferable insulation property is indicated in the case where the concentration of nitrogen in the insulating film is low.

From the above result, in the case where the gate insulating film is formed on silicon in the TFT, when an insulating film is formed in the first stage to improve a subthreshold coefficient and the first structure of a gate insulating film which has superior insulation property and is formed in the second stage is made, it is considered that TFT characteristics are obtained which are preferable characteristics with respect to the subthreshold coefficient and characteristics such that a leak current flowing between a gate electrode and a source electrode or a leak current flowing between a gate electrode and a drain electrode is suppressed.

A purpose of forming an insulating film in the first stage is to expose the surface of non-crystalline silicon to hydrogen plasma to terminate a dangling bond for trapping a charge with hydrogen. According to the present inventor, in the first stage, silicon is used as a target and hydrogen, $N_2O$, and Ar are used as sputtering gases. At this time, oxygen may be added as a sputtering gas. A purpose of flowing $N_2O$, in addition to Ar as an inert gas is to form a silicon oxynitride film to prevent impurity diffusion. If it is desired that a TFT in which a leak current between the gate electrode and the drain electrode due to impurity diffusion is suppressed is manufactured, $O_2$ may be flowed instead of $N_2O$. At this time, even when, for example, $SiO_2$ is used as a suitable target, for example, oxygen and hydrogen are used as suitable sputtering gases, and a film having the same composition is formed, the same effect as in the case of the first stage can be expected.

A purpose of forming an insulating film in the second stage is to improve insulation property thereby. In the case of this film formation, a method of forming the film in an atmosphere including sputtering gases at a low flow rate of nitrogen is effective as indicated in FIGS. 14A, 14B, 15A, and 15B. Preferably, sputtering is performed in an atmosphere which does not include a nitrogen atom. In the example of the second stage, $SiO_2$ is used as a target and oxygen and Ar are used as sputtering gases. However, even when, for example, silicon is used as a suitable target, for example, oxygen and Ar are used as suitable sputtering gases, and a film having the same composition is formed, the same effect as in the case of the second stage can be expected.

In particular, in the case of the first structure of the gate insulating film, when it is formed such that a region having 0.4 atomic % to 1.6 atomic % is present at concentration measurement of hydrogen in the film by an HFS analysis and a region having 0.2 atomic % or less is present in an upper layer on the region having 0.4 atomic % to 1.6 atomic % at concentration measurement of hydrogen in the film by an HFS analysis and then hydrogenation processing is performed for the manufactured TFT to improve the TFT characteristics, preferable characteristics such that subthreshold coefficients are 0.5 V/dec to 0.7 V/dec in an n-channel TFT and 0.5 V/dec to 1.0 V/dec in a p-channel TFT is indicated.

The present invention made from the above structure will be described in more detail based on the following embodiments.

[Embodiment 1]

In this embodiment, manufacturing steps of forming a TFT on a plastic substrate will be described below with reference to FIGS. 2A to 2E.

First, a plastic substrate 201 made of an organic matter is prepared. In this embodiment, the substrate 201 made of polyimide is used. A heat resistant temperature of the substrate made of polyimide is about 399° C. A color of the substrate itself is not transparent but brown. Then, a base insulating film 202 is formed on the substrate 201. In the case of a film formation method in which a process temperature does not exceed 300° C., this base insulating film is not particularly limited and formed here by a sputtering method. This sputtering method is used for film formation in an atmosphere which does not include hydrogen as a sputtering gas. Thus, the amount of hydrogen in the film is 5% or less.

Next, an amorphous semiconductor film is formed and crystallized by laser irradiation to form a crystalline semiconductor film. In the case of a film formation method in which a process temperature does not exceed 300° C., the amorphous semiconductor film is not particularly limited and formed here by a sputtering method. Then, the crystalline semiconductor film is patterned in a predetermined shape to form a semiconductor layer 203.

Figure 2A:
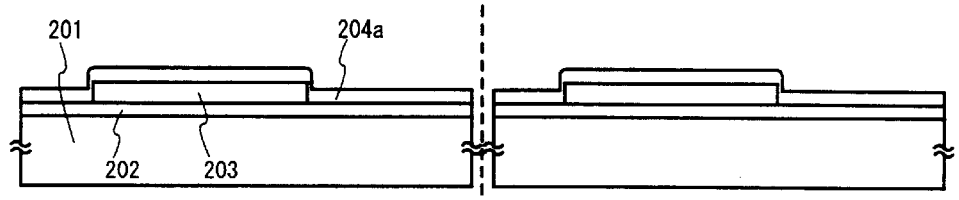
FIGS. 2A to 2E show manufacturing steps of the TFT.

Next, a gate insulating film 204 covering the semiconductor layer 203 is formed. The gate insulating film is formed by using a sputtering method (FIG. 2A). At this time, sputtering with a silicon target using argon, hydrogen, and $N_2O$ as sputtering gases is performed for film formation. Preferably, sputtering gases are $N_2O$ and $H_2$ and the flow rates are set to be 40 sccm and 30 sccm, respectively. Ar as a gas for heating the substrate is flowed into a chamber at 10 sccm. Film formation power is set to be 3 kW and a film formation pressure is set to be 0.4 Pa. In the insulating film thus formed, a region having 0.4 atomic % to 1.6 atomic % is present at concentration measurement of hydrogen in the film by an HFS analysis. Note that this insulating film is preferably formed and its film thickness is designed according to TFT characteristics to be desired. A leak current between the gate electrode and the source electrode or a leak current between the gate electrode and the drain electrode tends to increase as the film thickness increases.

Further, on this insulating film, another insulating film is formed by sputtering with an $SiO_2$ target using argon, oxygen, and hydrogen as sputtering gases. Preferably, silicon is used as a target, sputtering gases are $N_2O$ and $H_2$ and the flow rates are set to be 50 sccm and 0 sccm, respectively. Ar as a gas for heating the substrate is flowed into a chamber at 10 sccm. Film formation power is set to be 3 kW and a film formation pressure is set to be 0.4 Pa. When a concentration of hydrogen in the insulating film thus formed is measured by an HFS analysis, it becomes 0.2 atomic % or lower.

Figure 2B:
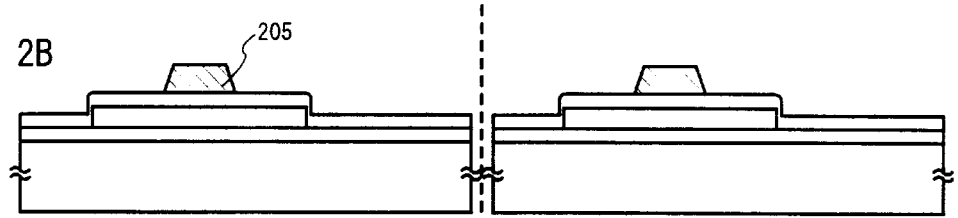

Then, a gate electrode 205 is formed (FIG. 2B). The gate electrode 205 may be made of an element selected from the group consisting of Ta, W, Ti, Mo, Al, Cu, Cr, and Nd, an alloy material including mainly the element, or a compound material including mainly the element. Also, a semiconductor film represented by a polycrystalline silicon film doped with an impurity element such as phosphorus may be used. Further, an AgPdCu alloy may be used.

Figure 2C:
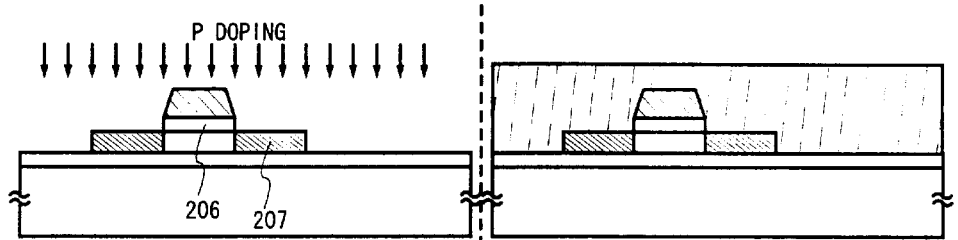

Next, the gate insulating film is etched in a self alignment using the gate electrode as a mask to form a gate insulating film 206 and to expose a portion of the semiconductor layer. Then, an impurity element for providing an n-type, here, phosphorus is added (doped) to the portion of the semiconductor layer to form impurity regions 207 (FIG. 2C). At this time, a resist is formed for a p-channel TFT and peeled after the addition of the impurity for providing the n-type.

Figure 2D:
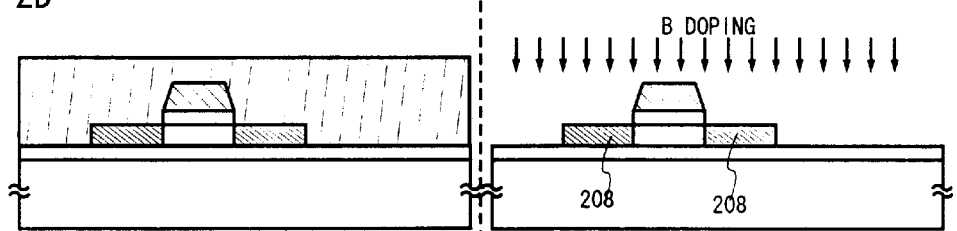

Next, the gate insulating film is etched in a self alignment using the gate electrode as a mask to form a gate insulating film and to expose a portion of the semiconductor layer. Then, an impurity element for providing a p-type, here, boron is added (doped) to the portion of the semiconductor layer to form impurity regions 208 (FIG. 2D). At this time, a resist is formed for an –channel TFT and peeled after the addition of the impurity for providing the p-type.

In this embodiment, doping is performed after etching of the gate insulating film. However, doping through the gate insulating film may be performed after the formation of the gate electrode. In this case, the impurity element is passed through the gate insulating film and doped in a self alignment using the gate electrode as a mask.

Next, an interlayer insulating film 210 is formed and respective contact holes which reach the source region or the drain region are formed. Then, a source wiring 211 electrically connected with the source region and a pixel electrode 212 electrically connected with the drain region are formed.

Then, hydrogenation processing is performed to improve the TFT characteristics. Thermal treatment in a hydrogen atmosphere (at 350° C. for 1 hour) or plasma hydrogenation at a low temperature is performed as this hydrogenation.

Figure 2E:
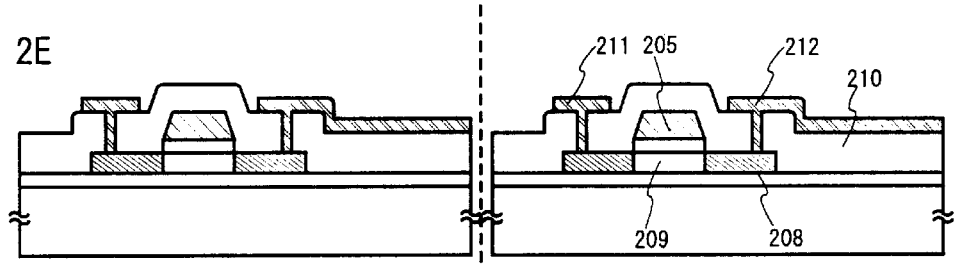

Top gate TFTs are completed on the plastic substrate at a process temperature of 350° C. or lower through the above manufacturing steps (FIG. 2E).

[Embodiment 2]

According to the present invention, a whole pixel portion and a whole driver circuit may comprise—channel TFTs for the reduction of steps, the improvement of yield, and the like. Here, a basic logic circuit such as an NAND circuit or an NOR circuit can comprise—channel TFTs and a further complicated logic circuit (a signal separation circuit, an operational amplifier, or a gamma (γ) correction circuit, and the like) can be also composed thereof.

Note that, when an element belonging to group 15 of the periodic table (preferably, phosphorus) or an element belonging to group 13 of the periodic table (preferably, boron) is added to a semiconductor as a channel forming region, an enhancement type TFT and a depletion type TFT can be separately formed as the TFTs indicated in this embodiment.

Further, there are the case where an NMOS circuit comprises a combination of n-channel TFTs, the case where a circuit comprises enhancement type TFTs (hereinafter referred to as an EEMOS circuit), and the case where a circuit comprises a combination of an enhancement type TFT and a depletion type TFT (hereinafter referred to as an EDMOS circuit). A driver circuit of a liquid crystal display device can also comprise only n-channel TFTs by a combination of these circuits.

[Embodiment 3]

An example in the case where a liquid crystal display is manufactured using the active matrix substrate obtained in Embodiment 1 or 2 is indicated below with reference to FIGS. 7A and 7B and FIG. 8.

Figure 7A:
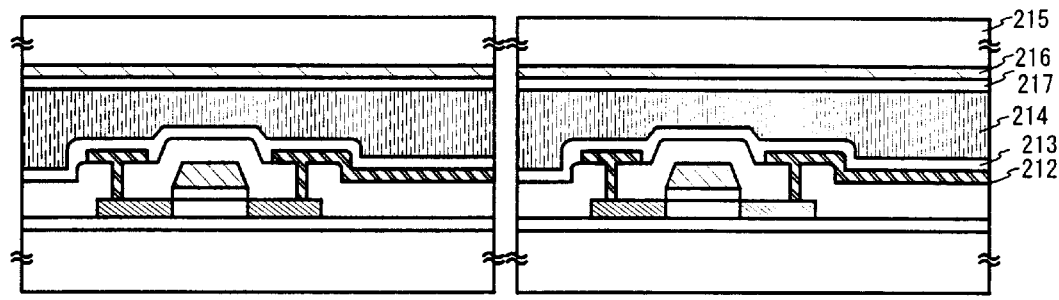
FIGS. 7A and 7B show manufacturing steps of an AM-LCD and an appearance thereof.

For the substrate manufactured in Embodiment 1 or 2, steps for formation of an orientation film 213, rubbing processing, bonding of an opposite substrate 215 including an orientation film 217 and an opposite electrode 216, injection of liquid crystal 214, and the like are performed to complete a reflection type liquid crystal display device (FIG. 7A).

Here, a metallic material having reflection property, for example, a material including mainly Al, Ag, or the like is used as the pixel electrode 212. Note that the example of the reflection type liquid crystal display device is indicated in this embodiment. However, when a transparent conductive film, for example, ITO (alloy of indium oxide and tin oxide), alloy of indium oxide and zinc oxide ($In_2O_3$—ZnO), zinc oxide (ZnO), or the like is used as the pixel electrode, a transmission type liquid crystal display device can be manufactured.

Figure 7B:
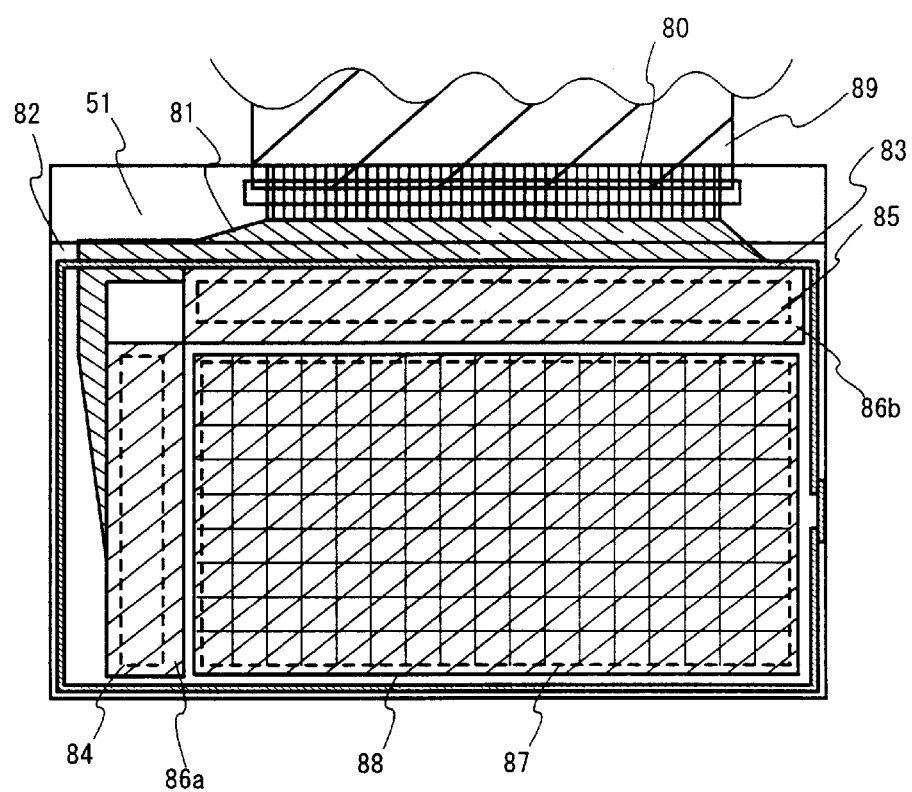

FIG. 7B is a top view of the liquid crystal display device. An active matrix substrate and an opposite substrate 82 in which a color filter and the like are provided are bonded through a seal member 83. In the active matrix substrate, a pixel portion, a driver circuit, an external input terminal to which an FPC (flexible printed circuit) is adhered, wirings 81 for connecting the external input terminal and input portions of the respective circuits, and the like are provided.

A light shielding layer 86a is provided in the opposite substrate side so as to overlap a gate side driver circuit 84. A light shielding layer 86b is provided in the opposite substrate side so as to overlap a source side driver circuit 85. Also, a color filter 88 is provided on a pixel portion 87 in the opposite substrate side so that the light shielding layers and colored layers of respective colors of a red color (R) a green color (G), and a blue color (B) correspond to respective pixels. In the case of actual display color display is produced by three colors of the colored layer of red color (R), the colored layer of green color (G), and the colored layer of blue color (B). However, colored layers of the respective colors are arbitrarily arranged.

Here, the color filter 88 is provided in the opposite substrate for colorization. However, the present invention is not particularly limited to this. Thus, when the active matrix substrate is manufactured, the color filter may be provided in the active matrix substrate.

Also, a light shielding layer is provided between adjacent pixels in the color filter to light-shield a region except a display region. Further, here, the light shielding layers 86a and 86b are provided in a region covering the driver circuit. However, when a liquid crystal display device is incorporated as a display unit of electronic equipment later, the region covering the driver circuit is covered with a cover. Thus, a structure such that the light shielding layers are not particularly provided may be used. Furthermore, when the active matrix substrate is manufactured, light shielding layers may be provided in the active matrix substrate.

Without providing the above light shielding layers, colored layers composing the plural color filter may be suitably arranged between the opposite substrate and the opposite electrode so as to make light-shielding by a laminate of the colored layers to light-shield the region except the display region (gaps between respective pixel electrodes) and the driver circuit.

Also, an FPC 89 comprising a base film and wirings is adhered to the external input terminal through an anisotropic conductive resin. Further, a reinforcing plate is provided to improve a mechanical strength.

Thus, the manufactured liquid crystal display device can be used as the display unit of various electronic devices.

Figure 8:
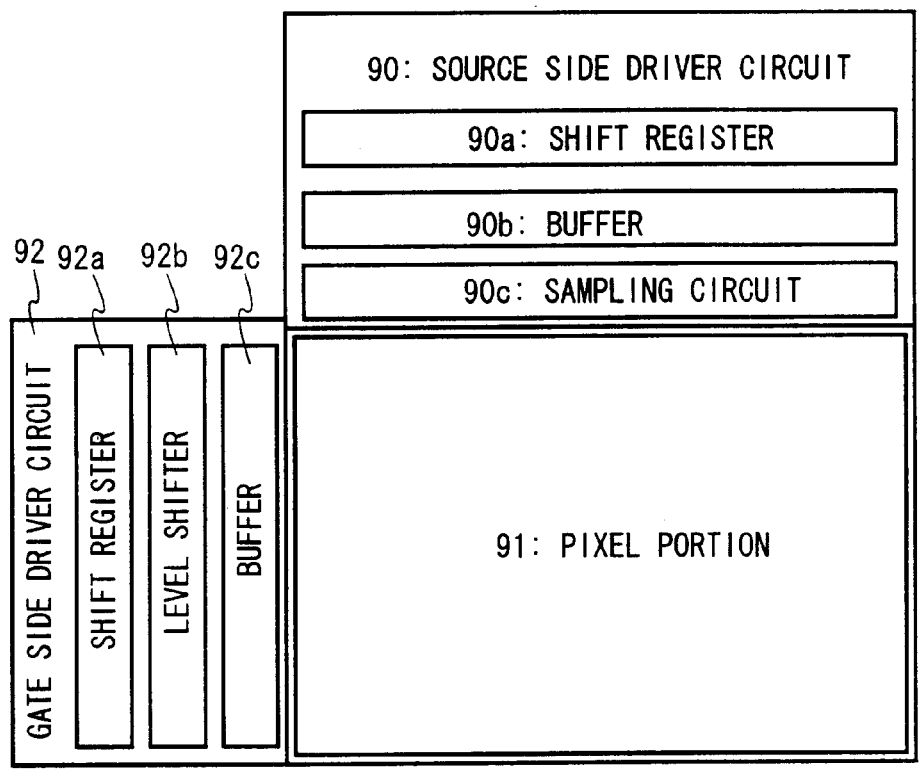
FIG. 8 is a circuit block diagram of the AM-LCD.

FIG. 8 is a block diagram of the above liquid crystal display device. FIG. 8 shows a structure of a circuit for performing analog drive. In this embodiment the device includes a source side driver circuit 90, a pixel portion 91, and a gate side driver circuit 92. Note that the driver circuit in this embodiment is a generic name including the source side driver circuit and the gate side driver circuit.

In the source side driver circuit 90, a shift register 90a, a buffer 90b, a sampling circuit (transfer gate) 90c are provided. Also, a shift register 92a, a level shifter 92b, and a buffer 92c are provided in the gate side driver circuit 92. If need, a level shifter circuit may be provided between the sampling circuit and the shift register.

Also, in this embodiment, the pixel portion 91 includes a plurality of pixels. A TFT element is provided for each of the plurality of pixels.

The source side driver circuit 90 and the gate side driver circuit 92 comprise only n-channel TFTs and all circuits are constructed using an EEMOS circuit as a basic unit. However, consumption power is slightly increased as compared with a conventional CMOS circuit.

Note that, although not shown, a gate side driver circuit may be further provided in an opposite side to the gate side driver circuit 92 with respect to the pixel portion 91.

[Embodiment 4]

Figure 9:
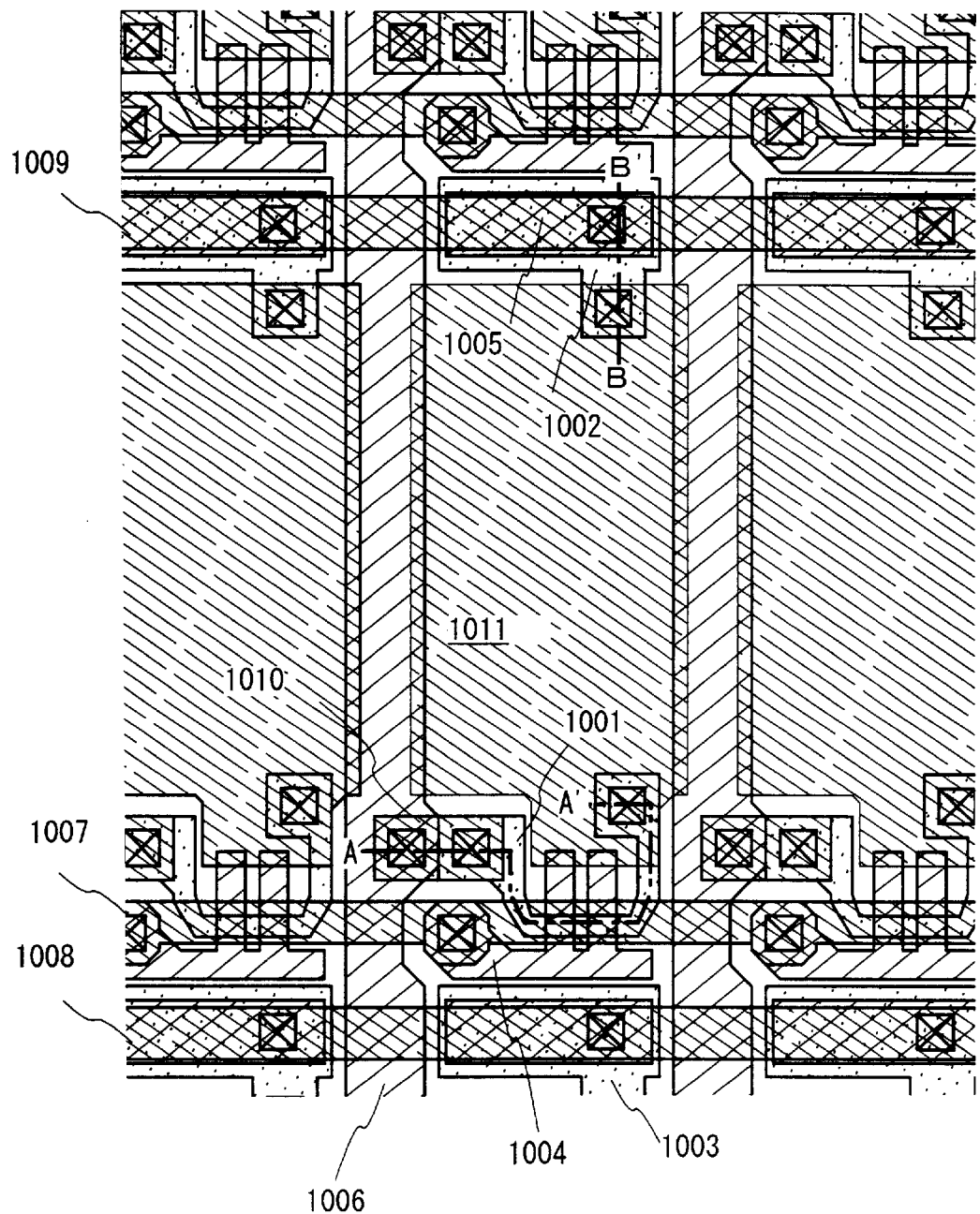
FIG. 9 is a top view of a pixel portion.
Figure 10:
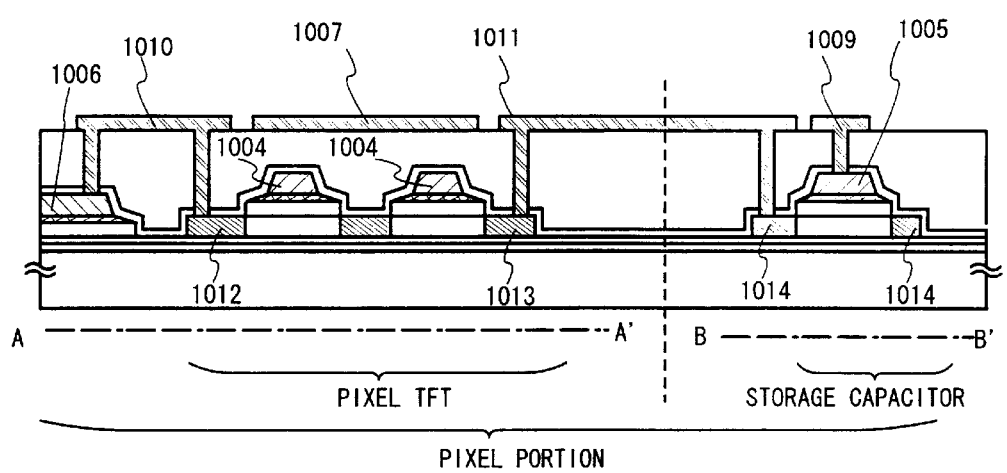
FIG. 10 is a cross sectional view of the pixel portion.

In this embodiment, a pixel structure is shown in FIG. 9 and a cross sectional structure thereof is shown in FIG. 10. An A-A' cross sectional view and a B-B' cross sectional view are indicated.

In this embodiment, a retaining capacitor comprises an insulating film located on a second semiconductor layer 1002 as a dielectric, the second semiconductor layer 1002, and a capacitor electrode 1005. Note that the capacitor electrode 1005 is connected with a capacitor wiring 1009. Also, the capacitor electrode 1005 is simultaneously formed together with a first electrode 1004 and a source wiring 1006 on the same insulating film. The capacitor wiring is simultaneously formed together with a pixel electrode 1011, a connection electrode 1010, and a gate wiring 1007 on the same insulating film.

Also, in this embodiment, an impurity element for providing an n-type is added to impurity regions 1012 to 1014. Note that reference numeral 1012 denotes a source region and 1013 denotes a drain region.

Further, in this embodiment, the example in the case where the gate electrode and the source wiring are simultaneously formed is indicated. However, the number of mask is increased by one and a step of forming the gate electrode may be different from a step of forming the first electrode and the capacitor wiring. That is, first, only a portion which is overlapped with a semiconductor layer and becomes the gate electrode is formed, an n-type impurity element is added thereto, and thermal treatment is performed at low temperature. Then, the first electrode is formed to overlap the gate electrode. At this time, a contact between the gate electrode and the first electrode is produced by only overlapping without forming contact holes. Also, the source wiring and the capacitor wiring are formed simultaneously with the first electrode. Thus, aluminum or copper, which has a low resistance can be used as a material for the first electrode and the source wiring. When an n-type impurity element is added to the semiconductor layer overlapped with the capacitor wiring, a retaining capacitance can be increased.

Note that this embodiment can be freely combined with any one of Embodiments 1 to 4.

[Embodiment 5]

The present invention can be also applied to an active matrix EL display. This example is shown in FIG. 11.

Figure 11:
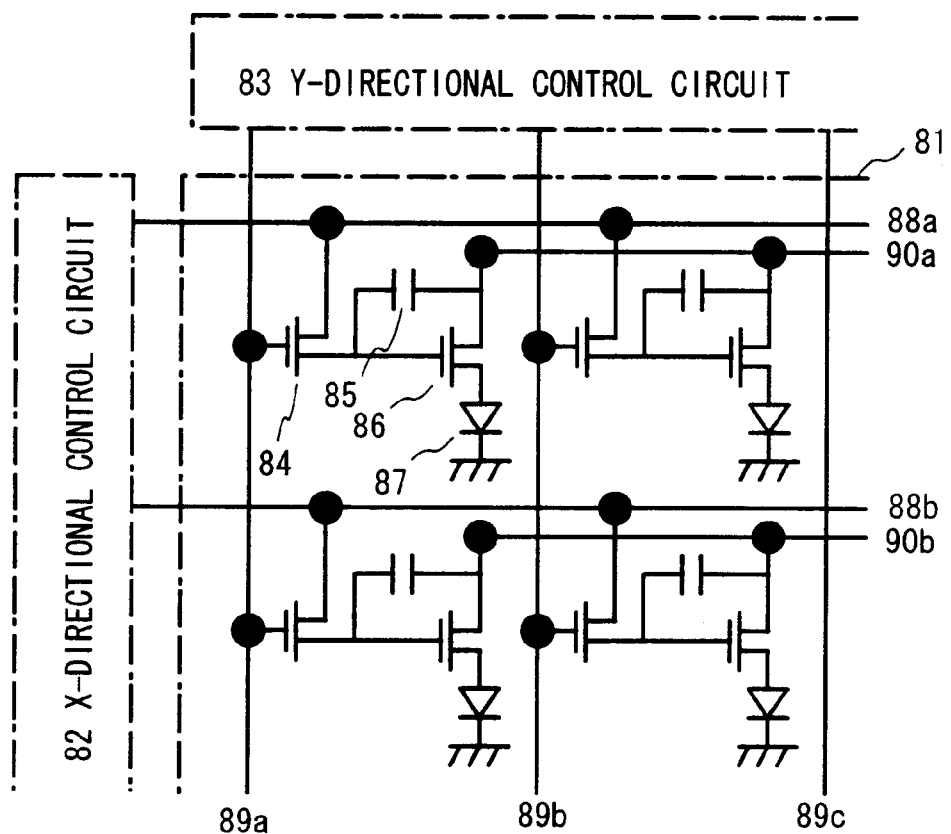
FIG. 11 shows a circuit structure of an active matrix EL display device.

FIG. 11 is a circuit diagram of the active matrix EL display. Reference numeral 81 denotes a pixel portion and an X-directional control circuit 82 and a Y-directional control circuit 83 are provided in the vicinity thereof. Each pixel in the pixel portion 81 includes a switching TFT 84, a capacitor 85, a current control TFT 86, and an organic EL element 87. An X-directional signal line 88*a* (or 88*b*) and a Y-directional signal line 89*a* (or 89*b* or 89*c*) are connected with the switching TFT 84. Power source lines 90*a* and 90*b* are connected with the current control TFT 86.

According to the active matrix EL display of this embodiment, the CMOS circuit manufactured in Embodiment 1 can be used as the X-directional control circuit 82, the Y-directional control circuit 83, or the current control TFT 86 and a pixel TFT can be used as the switching TFT 84. That is, according to the active matrix EL display of this embodiment, an EL layer may be formed by a known means after the active matrix substrate is manufactured as Embodiments 1 to 3.

[Embodiment 6]

The driver circuit and the pixel portion manufactured in accordance with the present invention can be used in various electro-optical devices (active matrix type liquid crystal display and active matrix type EL display). In other words, the present invention can be applied to all of the electronic equipments having these electro-optical devices as the display section.

The following can be given as examples of the electronic equipment: video cameras; digital cameras; head mounted displays (goggle type display); personal computers; portable information terminals (such as mobile computers, portable telephones and electronic notebook). An example of these is shown in FIGS. 12 and 13.

Figure 12A:
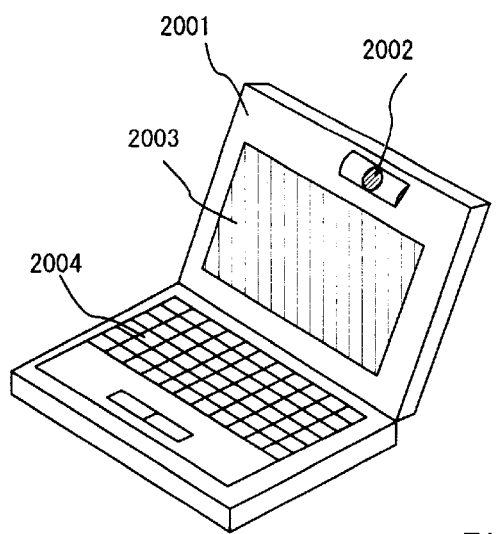
FIGS. 12A to 12F show examples of electronic devices.

FIG. 12A shows a personal computer, and it includes a main body 2001, an image input section 2002, a display portion 2003, and a keyboard 2004. The present invention is applicable to the display portion 2003 and other driver circuit.

Figure 12B:
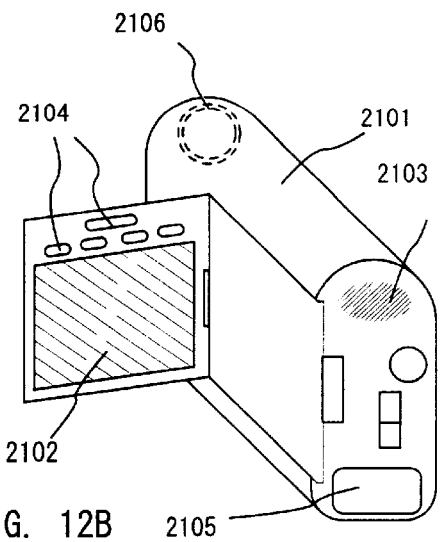

FIG. 12B shows a video camera, and it includes a main body 2101, a display portion 2102, a voice input section 2103, operation switches 2104, a battery 2105, and an image receiving section 2106. The present invention is applicable to the display portion 2102 and other driver circuit.

Figure 12C:
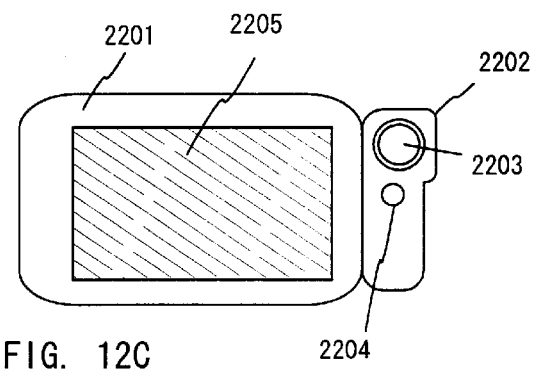

FIG. 12C shows a mobile computer, and it includes a main body 2201, a camera section 2202, an image receiving section 2203, operation switches 2204, and a display portion 2205. The present invention is applicable to the display portion 2205 and other driver circuit.

Figure 12D:
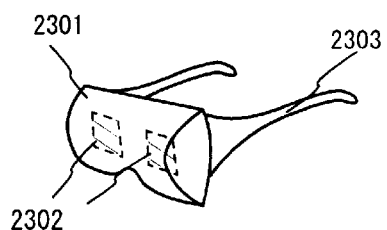

FIG. 12D shows a goggle type display, and it includes a main body 2301; a display portion 2302; and an arm section 2303. The present invention is applicable to the display portion 2302 and other driver circuit.

Figure 12E:
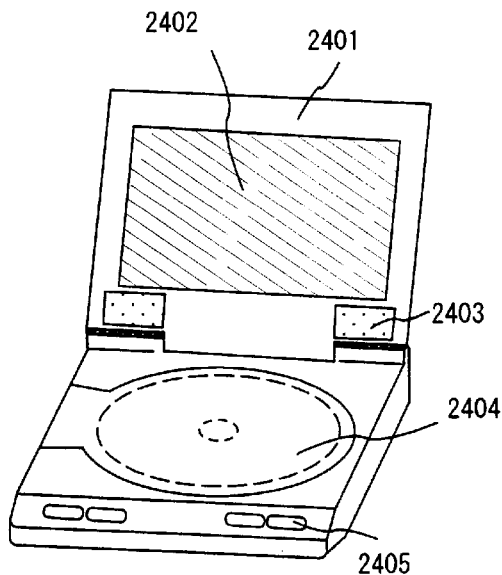

FIG. 12E shows a player using a recording medium which records a program (hereinafter referred to as a recording medium), and it includes a main body 2401; a display portion 2402; a speaker section 2403; a recording medium 2404; and operation switches 2405. This player uses DVD (digital versatile disc), CD, etc. for the recording medium, and can be used for music appreciation, film appreciation, games and Internet. The present invention is applicable to the display portion 2402 and other driver circuit.

Figure 12F:
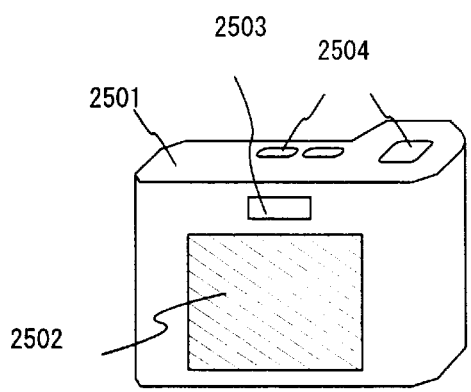

FIG. 12F shows a digital camera, and it includes a main body 2501; a display portion 2502; a view finder 2503; operation switches 2504; and an image receiving section (not shown in the figure). The present invention can be applied to the display portion 2502 and other driver circuit.

Figure 13A:
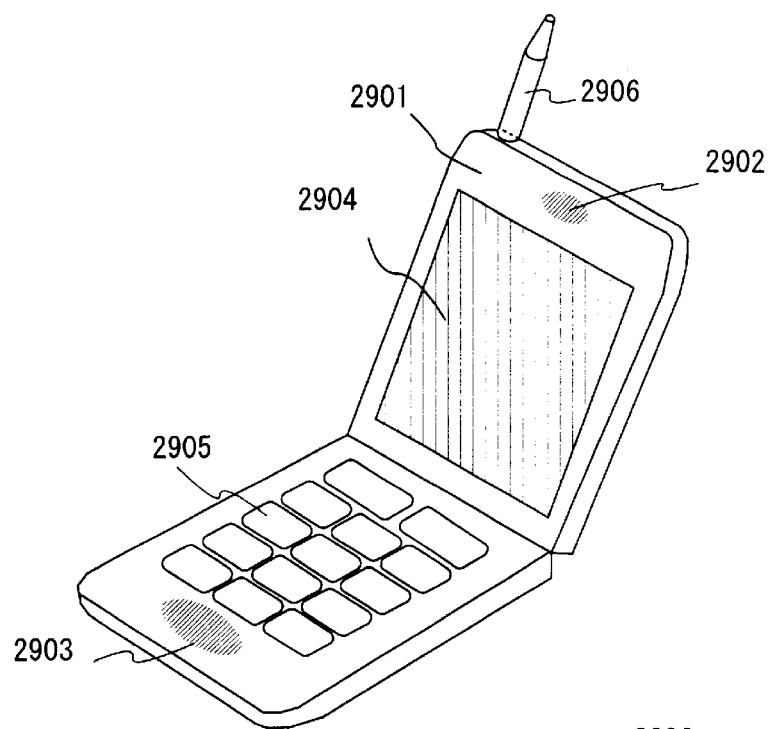
FIGS. 13A to 13C show examples of electronic devices.

FIG. 13A shows a portable telephone, and it includes a main body 2901, an audio output section 2902, an audio input section 2903, a display portion 2904, operation switches 2905, and an antenna 2906. The present invention can be applied to the display portion 2904 and other driver circuit.

Figure 13B:
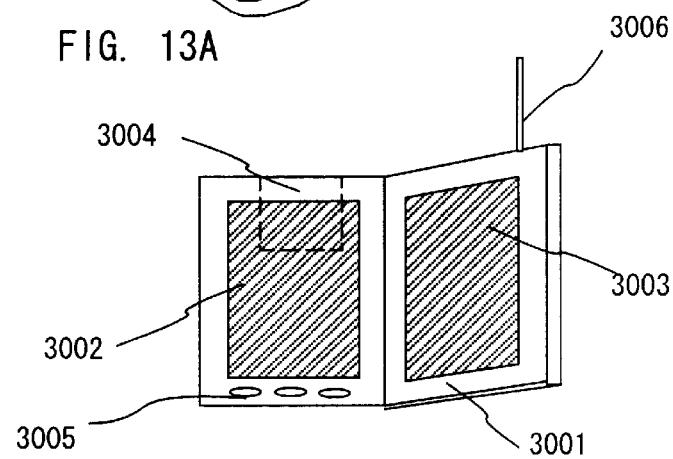

FIG. 13B shows a portable book (electronic book), and it includes a main body 3001, display portions 3002 and 3003, a recording medium 3004, operation switches 3005, and an antenna 3006. The present invention can be applied to the display portions 3002 and 3003 and other driver circuit.

Figure 13C:
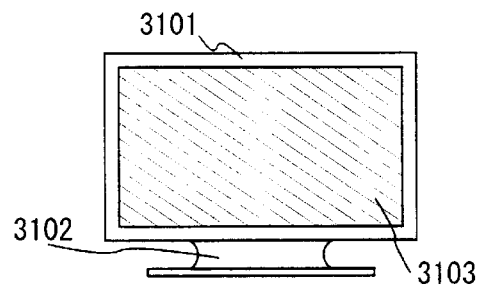

FIG. 13C shows a display, and it includes a main body 3101, a support stand 3102, and a display portion 3103. The present invention can be applied to the display portion 3103. The display of the present invention is advantageous for a large size screen in particular, and is advantageous for a display equal to or greater than 10 inches (especially equal to or greater than 30 inches) in diagonal.

The applicable range of the present invention is thus extremely wide, and it is possible to apply the present invention to electronic equipment in all fields. Especially, it is applicable to the electronic equipment demanded for a lightened. Further, the electronic equipment of Embodiment 6 can be realized by using a constitution of any combination of Embodiments 1 to 6.

According to the present invention, an electro-optical device can be manufactured at a low temperature for a short time. Thus, a yield and a throughput can be improved and a manufacturing cost can be reduced.

Also, since a low-cost electro-optical device can be manufactured, various electronic equipment using it as a display unit can be provided at a low cost.

What is claimed is:

1. A method of manufacturing a semiconductor devices comprising the steps of:

forming a semiconductor layer on an insulating surface;

forming a gate insulating film on the semiconductor layer; and forming a conductive layer on the gate insulating film, wherein the step of forming the gate insulating film is performed by a sputtering method using one of silicon and silicon oxide as a target and has a first stage for forming a first insulating film including mainly silicon, oxygen, and nitrogen and further including hydrogen at a concentration of 0.4 atomic % to 1.6 atomic % and a second stage for forming a second insulating film including mainly silicon and oxygen and further including hydrogen at a concentration of 0.2 atomic % or lower.

2. A method according to claim 1, wherein, in the first stage, silicon oxide is used as a target and a gas including a noble gas and hydrogen is used as a sputtering gas.

3. A method according to claim 1, wherein, in the first stage, silicon is used as a target and a gas including a noble gas and hydrogen is used as a sputtering gas.

4. A method according to claim 1, wherein, in the second stage, silicon oxide is used as a target and a gas including a noble gas and oxygen is used as a sputtering gas.

5. A method according to claim 1, wherein, in the second stage, silicon is used as a target and a gas including a noble gas and oxygen is used as a sputtering gas.

6. A method according to claim 1, further comprising the step of hydrogenating the semiconductor layer at 350° C. or lower after the gate insulating film is formed.

7. A method according to claim 1, wherein the semiconductor device is one selected from the group consisting of a video camera, a digital camera, a goggle type display, a personal computer, and a portable information terminal.

8. A method of manufacturing a semiconductor device, comprising the steps of:

forming a semiconductor layer on a plastic substrate;

forming a gate insulating film on the semiconductor layer; and forming a conductive layer on the gate insulating film, wherein the step of forming the gate insulating film is performed by a sputtering method using one of silicon and silicon oxide as a target and has a first stage for forming a first insulating film including mainly silicon, oxygen, and nitrogen and further including hydrogen at a concentration of 0.4 atomic % to 1.6 atomic % and a second stage for forming a second insulating film including mainly silicon and oxygen and further including hydrogen at a concentration of 0.2 atomic % or lower.

9. A method according to claim 8, wherein, in the first stage, silicon oxide is used as a target and a gas including a noble gas and hydrogen is used as a sputtering gas.

10. A method according to claim 8, wherein, in the first stage, silicon is used as a target and a gas including a noble gas and hydrogen is used as a sputtering gas.

11. A method according to claim 8, wherein, in the second stage, silicon oxide is used as a target and a gas including a noble gas and oxygen is used as a sputtering gas.

12. A method according to claim 8, wherein, in the second stage, silicon is used as a target and a gas including a noble gas and oxygen is used as a sputtering gas.

13. A method according to claim 8, further comprising the step of hydrogenating the semiconductor layer at 350° C. or lower after the gate insulating film is formed.

14. A method according to claim 8, wherein the semiconductor device is one selected from the group consisting of a video camera, a digital camera, a goggle type display, a personal computer, and a portable information terminal.

15. A method of manufacturing a semiconductor device, comprising the steps of:

forming a semiconductor layer on an insulating surface;

forming a first insulating film comprising silicon, oxygen, and nitrogen on the semiconductor layer by a sputtering method, said first insulating film further including hydrogen;

forming a second insulating film comprising silicon, and oxygen by the sputtering method, said second insulating film further including hydrogen at a lower concentration than that of the first insulating film; and forming a conductive layer on the first and second insulating films.

16. A method according to claim 15, wherein said conductive layer function as a gate electrode of a thin film transistor.

17. A method according to claim 15, wherein said first and second insulating films function as a gate insulating film of a thin film transistor.

18. A method according to claim 15, wherein said first insulating film includes hydrogen at a concentration of of 0.4 atomic % to 1.6 atomic %.

19. A method according to claim 15, wherein said second insulating film includes hydrogen at a concentration of 0.2 atomic % or lower.

20. A method according to claim 15, wherein said sputtering method for forming the first and second insulating films uses one of silicon and silicon oxide as a target.

21. A method according to claim 15, wherein the semiconductor device is one selected from the group consisting of a video camera, a digital camera, a goggle type display, a personal computer, and a portable information terminal.

* * * * *